United States Patent
Tajima et al.

[11] Patent Number: 5,726,491
[45] Date of Patent: Mar. 10, 1998

[54] TAPE CARRIER PACKAGE

[75] Inventors: Naoyuki Tajima, Kitakatsurayi-gun; Yoshinori Ogawa, Yamatotakada; Seijirou Gyouten, Tenri, all of Japan

[73] Assignee: Sharp Kabushiki Kaisha, Osaka, Japan

[21] Appl. No.: 672,587

[22] Filed: Jun. 28, 1996

[30] Foreign Application Priority Data

Jun. 29, 1995 [JP] Japan ................... 7-163730
Mar. 22, 1996 [JP] Japan ................... 8-065824

[51] Int. Cl.$^6$ ........................... H01L 23/495
[52] U.S. Cl. ........... 257/668; 257/786; 257/787
[58] Field of Search ................. 257/666, 668, 257/701, 787, 679, 786

[56] References Cited

U.S. PATENT DOCUMENTS

| | | | |
|---|---|---|---|
| 4,812,421 | 3/1989 | Jung et al. | 257/668 |
| 5,214,845 | 6/1993 | King et al. | 257/668 |
| 5,227,232 | 7/1993 | Lim | 257/668 |
| 5,598,030 | 1/1997 | Imai et al. | 287/666 |

FOREIGN PATENT DOCUMENTS

| | | |
|---|---|---|
| 1173957 | 12/1989 | Japan . |
| 2-211643 | 8/1990 | Japan ........................ 257/668 |
| 547849 | 2/1993 | Japan . |

*Primary Examiner*—Mahshid D. Saadat
*Assistant Examiner*—S. V. Clark

[57] ABSTRACT

A tape carrier package of the invention includes: an insulating film having a device hole; a conductor pattern formed on the insulating film; and conductor leads electrically connected to the conductor pattern and projected inward beyond the edge of the device hole, and the conductor leads is electrically connected to electrode pads of a semiconductor chip. In this arrangement, the electrode pads of the semiconductor chip are arranged in at least two rows which are parallel to opposite two sides of the semiconductor chip, the two opposite rows of pads are disposed closer to the center of the two rows than to the edge of semiconductor chip, and the element-forming surface of the entire semiconductor chip containing the region between the insulating film and the semiconductor chip, is sealed with a sealing resin, except the part of the electrode pads.

7 Claims, 14 Drawing Sheets

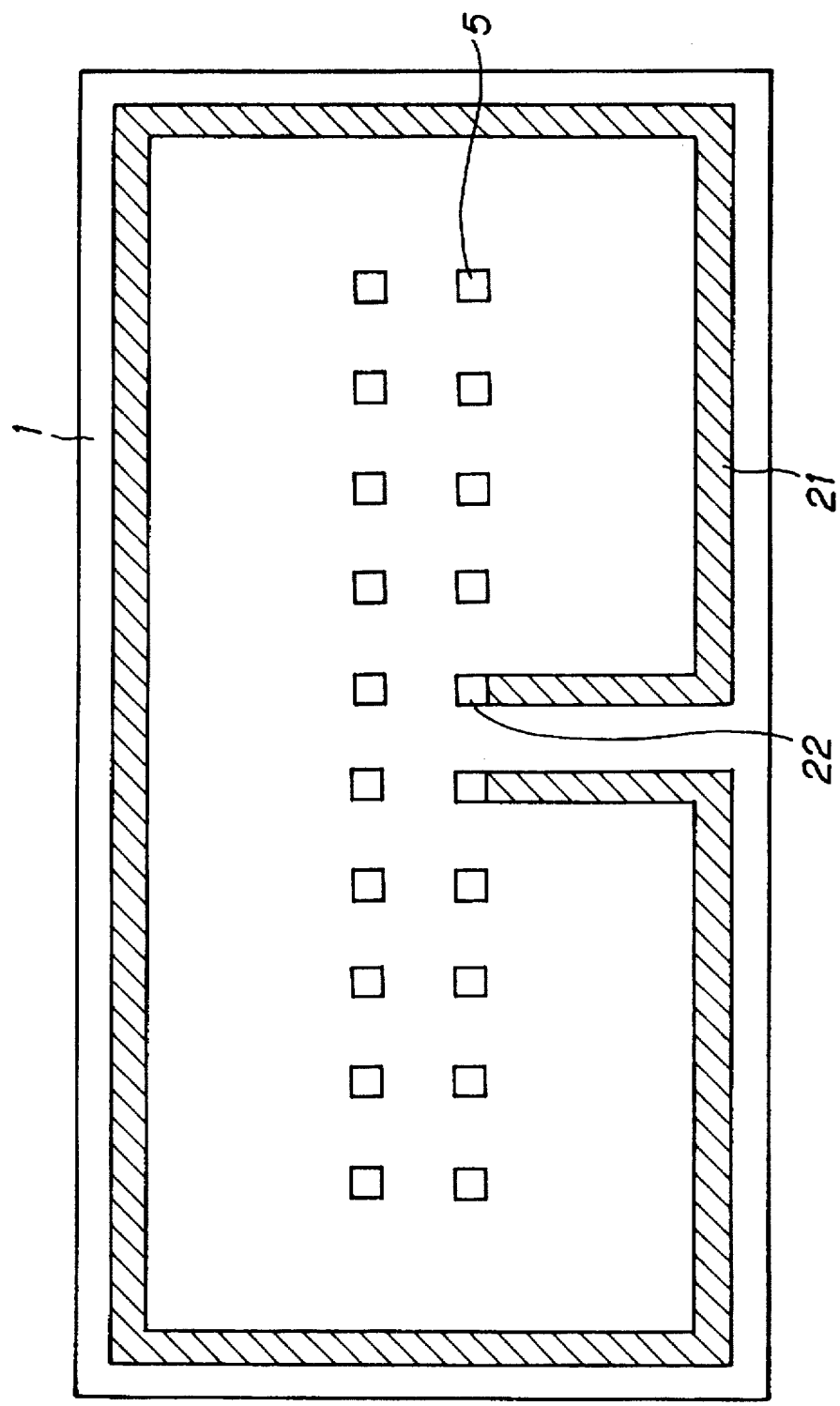

TAPE CARRIER PACKAGE

BACKGROUND OF THE INVENTION

(1) Field of the Invention

The present invention relates to a tape carrier package.

(2) Description of the Prior Art

Tape carrier packages (to be referred to as 'TCPs' hereinbelow) are the most suitable packaging form for packaging multi-pinned semiconductor devices in a small-sized unit, and are most widely used currently as the method of packaging liquid crystal display panel-driving semiconductor devices.

FIG. 1 shows an example of packaging a liquid crystal display panel (to be referred to as LCD panel hereinbelow) using a TCP. In FIG. 1, the arrangement includes: a semiconductor chip 1, an insulating film 2, an adhesive 3, a conductor pattern 4, a metal bump 5, a sealing resin 6, a device hole 7, an inner lead 8, an LCD panel 14, an anisotropic conductive film 15, a printed-wiring board 16, and an insulative resin 17 for protecting the conductor pattern that is exposed to the outside through slits which are formed in the insulating film at flexed regions. The connection of the LCD panel 14 is carried out by temporarily attaching the anisotropic conductive film 15 to the electrode leads provided on the glass by the edge of the LCD panel 14, aligning the TCP output leads with the LCD panel output leads, and pressing the connecting portion with a heated tool. In this case, any parts of the TCP other than the output terminal portion are spread out around the glass edge of the LCD panel 14. If the size of this extra part (to be referred to 'frame size' hereinbelow) is large, the size of the liquid crystal module becomes large, resulting in lowering of the ratio of the display area to the entire module area. Particularly, when the outside dimension of the module has to be strictly restricted, such as the personal computers of note type or sub-note type, or PDA (personal digital assistance), the frame size must be reduced to the minimum.

In order to meet these requirements, some structures use so-called 'slim TCPs' in which bar-shaped LCD-driving semiconductor chips are packaged in place of conventional chips of square or rectangular shape. Other configurations uses a flexed structure in which the TCP is bent at the edge of the LCD panel glass. FIGS. 2 and 3 are views showing practical uses of the slim TCP and the flexed type of TCP, respectively.

As seen in FIG. 3, the bending type TCP is able to minimize the frame size. This structure, however, needs flexed regions to enable the TCP as a whole to become large, giving rise to increase of cost as well as increasing the thickness of the resulting liquid crystal module. Further, this structure needs an extra process, i.e., bending stage, resulting in a disadvantage to simplifying the production process.

In contrast, the frame size of the slim TCP becomes larger than that of the flexed type of TCP, but the TCP itself is smaller in size and is advantageous as to cost. Besides, since there is no necessity to add the bending stage, the production process can be simplified.

From the above reasons, the slim TCPs have been increasingly used for large-scaled LCD panels for OA apparatuses.

The semiconductor chip in the slim TCP has been tried to be as slender as possible and the areas for conductor cables in the TCP have been tried to be as small as possible in order to reduce the frame size. Nevertheless, the increase of the number of output terminals required as well as the augment of the performances and functions demanded for the semiconductor chip, means that the reduction of the width of the semiconductor chip is almost reaching its limit.

As demands for large-sized LCD panels and the compact-sized modules have been increasing in the market, the reduction of the size of the frame has been strongly requested.

However, as long as the semiconductor chip with electrode pads arranged along the periphery of the chip is used, it is impossible to make the frame size smaller than the sum of the length of the semiconductor chip, the TCP wiring area, the resin sealed area and the length of input terminals. This is the limitation of the slim TCP.

Further, since the distance between the input terminal portion and the semiconductor chip in the conventional slim TCP is extremely short, the mechanical strength is not great enough to stand the stress which is generated during the connecting of the input terminals of the TCP with the printed board, or the vibration caused by conveyance during the packaging process. Particularly, when the distance between the semiconductor chip and the input terminals is shortened excessively to fit the requirement for the compulsory of the frame size, the sealed resin may crack due to the stress mentioned above or the inner lead might become disconnected.

Conventionally, some proposals of TCPs, for example, Japanese Patent Application Laid-Open Hei 5 No.47,849 and Japanese Utility Model Laid-Open Hei 1 No.173,957, have disclosed that the size of the device hole should be equal to or smaller than the chip size and the TCP wiring area as well as the resin sealed area should be minimized in order to reduce the frame size altogether.

However, the main object of the above structure was to prevent the short-circuit of the inner leads at the edge of the semiconductor chip by bringing the TCP insulating film into contact with only the edge of the chip. Hence, it was impossible to cover the surface of the element-forming region. This is because the insulating layer which protects the surface of the element-forming region came into contact with the insulating film, so that the entire area of the element forming region could not be covered with the resin when the device was resin-sealed. Therefore, it was impossible to prevent the intrusion of damp or moisture thus resulting in unreliability of the device.

As a result, the dimension could only be reduced by the small amount of the length of the inner leads (400 to 800 µm), which corresponds to the gap between the device hole and the semiconductor chip in a normal TCP (200 to 400 µm in a typical slim TCP). In one word, the effect of the reduction of the TCP size is of small value.

Further, since the distance between the input terminals and the electrode pads of the semiconductor chip remains short and the overlapping region of the insulating film and the semiconductor chip is extremely narrow, the effect on the improvement of the mechanical strength is little.

SUMMARY OF THE INVENTION

It is therefore an object of the present invention to provide a tape carrier package (TCP) which allows the frame of a device having the semiconductor chip of equal size as has been used conventionally, to be down-sized and still increases its mechanical strength.

In order to attain the above object, the gist of the invention is as follows:

In accordance with the first feature of the invention, a tape carrier package includes: an insulating film having a device hole; a conductor pattern formed on the insulating film; and conductor leads electrically connected to the conductor pattern and projected inward beyond the edge of the device hole, the conductor leads is electrically connected to electrode pads of a semiconductor chip, and is constructed such that the electrode pads of the semiconductor chip are arranged in at least two rows which are parallel to opposite two sides of the semiconductor chip, the two opposite rows of pads are disposed closer to the center of the two rows than to the edge of semiconductor chip, the device hole is positioned within the element-forming region of the semiconductor chip; and the element-forming surface of the entire semiconductor chip containing the region between the insulating film and the semiconductor chip, is sealed with a sealing resin, except the part of the electrode pads.

In accordance with the second feature of the invention, a tape carrier package having the first feature is constructed such that supporting means for spacing the semiconductor chip from the insulating film by a predetermined distance is provided between the semiconductor chip and the insulating film.

In accordance with the third and fourth features of the invention, a tape carrier package having the first or second feature is constructed such that the linear expansion coefficient of the insulating film and the linear expansion coefficient of the sealing resin are both $30 \times 10^{-6}/°C$. or less.

In accordance with the fifth and sixth features of the invention, a tape carrier package having the second or fourth feature is constructed such that the supporting means is an integrally formed structure of a conductive material or a plurality of elements of a conductive material, and the structure or the elements are arranged loop-wise in the peripheral part around the element-forming region of the semiconductor chip, and are electrically integrally connected to outside electrodes.

In the structures described above, it is possible to produce a TCP which is smaller than the conventional one, by using a semiconductor chip which is equal in size to the conventional configuration. As a result, it is possible to reduce the frame size of a liquid crystal display panel.

Since the TCP is structured so that the insulating film is laid over the semiconductor chip, the mechanical strength of the TCP can markedly be improved. As a result, the reliability against the stress generated in the TCP during the TCP packaging stage can be improved.

Further, since the semiconductor chip and the insulating film are supported with a fixed spacing distance, this structure allows the sealing resin to surely seal the semiconductor chip surface which lies between the semiconductor chip and the insulating film.

If the chip is cracked or nicked, the electrically integrally formed supporting means will be disconnected, thus making it possible to detect the cracks or nicks of the chip.

BRIEF DESCRIPTION OF THE DRAWINGS

FIG. 14 is the second plan in which spacer bumps of the invention are arrayed in a single row.

DESCRIPTION OF THE PREFERRED EMBODIMENTS

The present invention will hereinafter be described in detail with reference to the embodiments.

Figure 1:
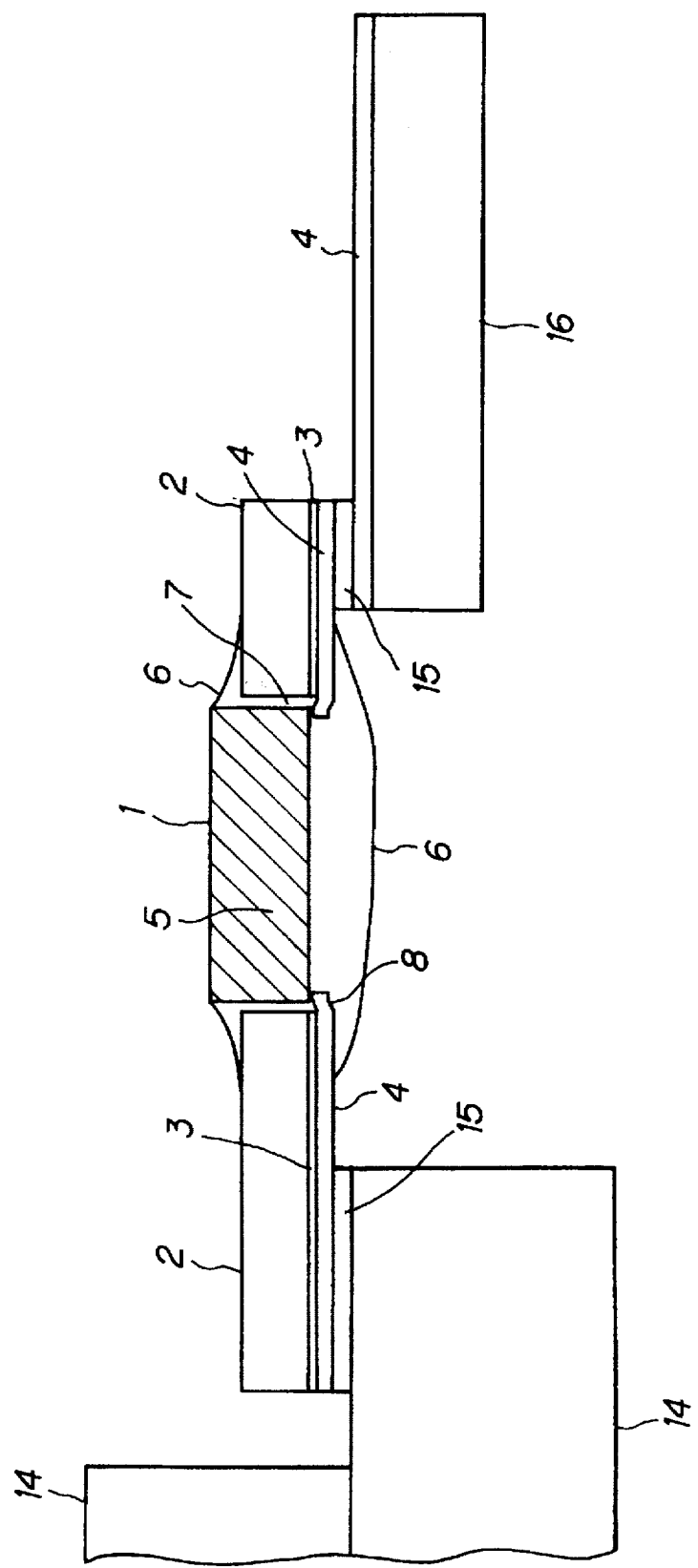
FIG. 1 is a view showing an example of the application of a TCP to an LCD panel.
Figure 2:
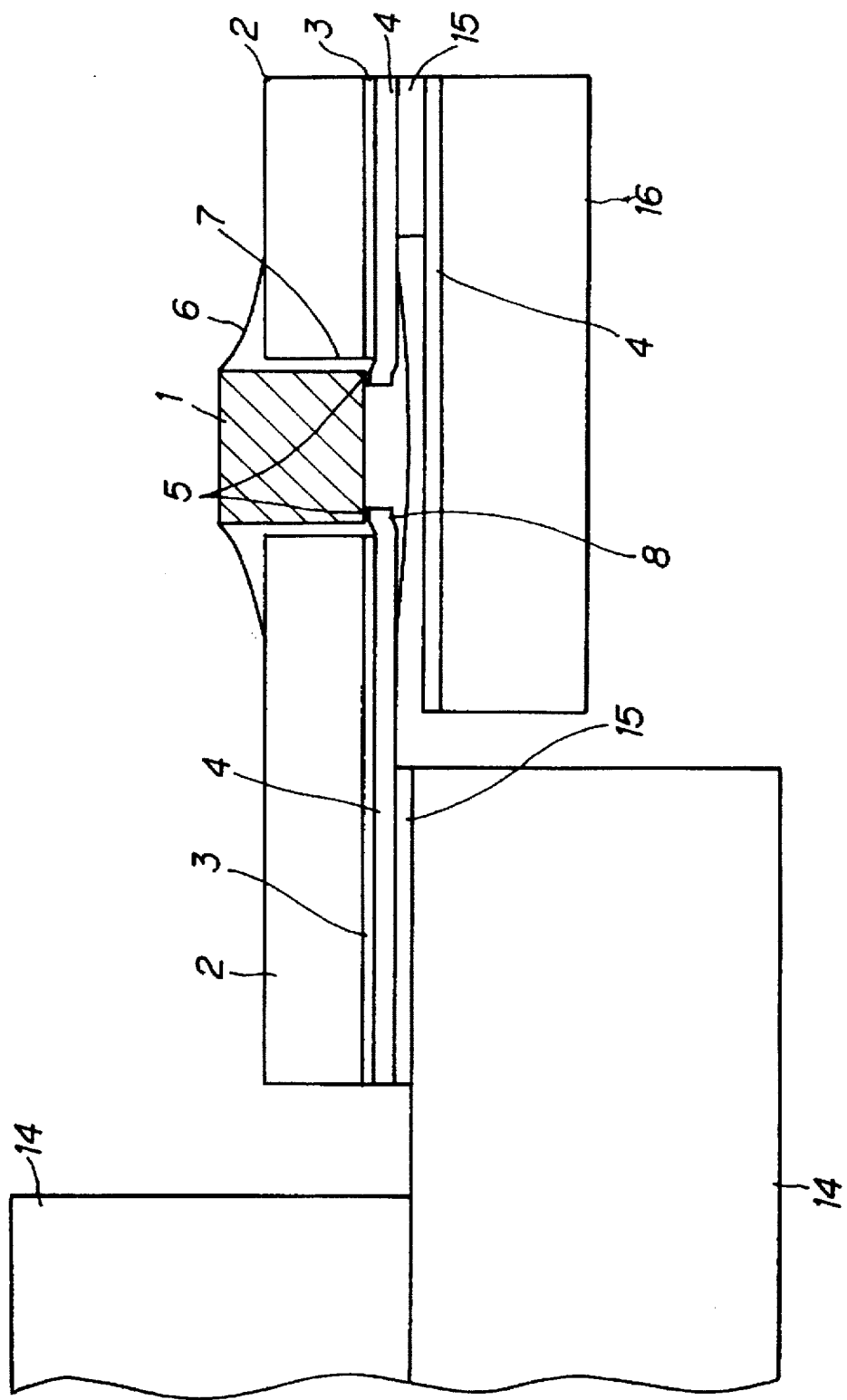
FIG. 2 is a view showing an example of a practical use of a slim TCP.
Figure 3:
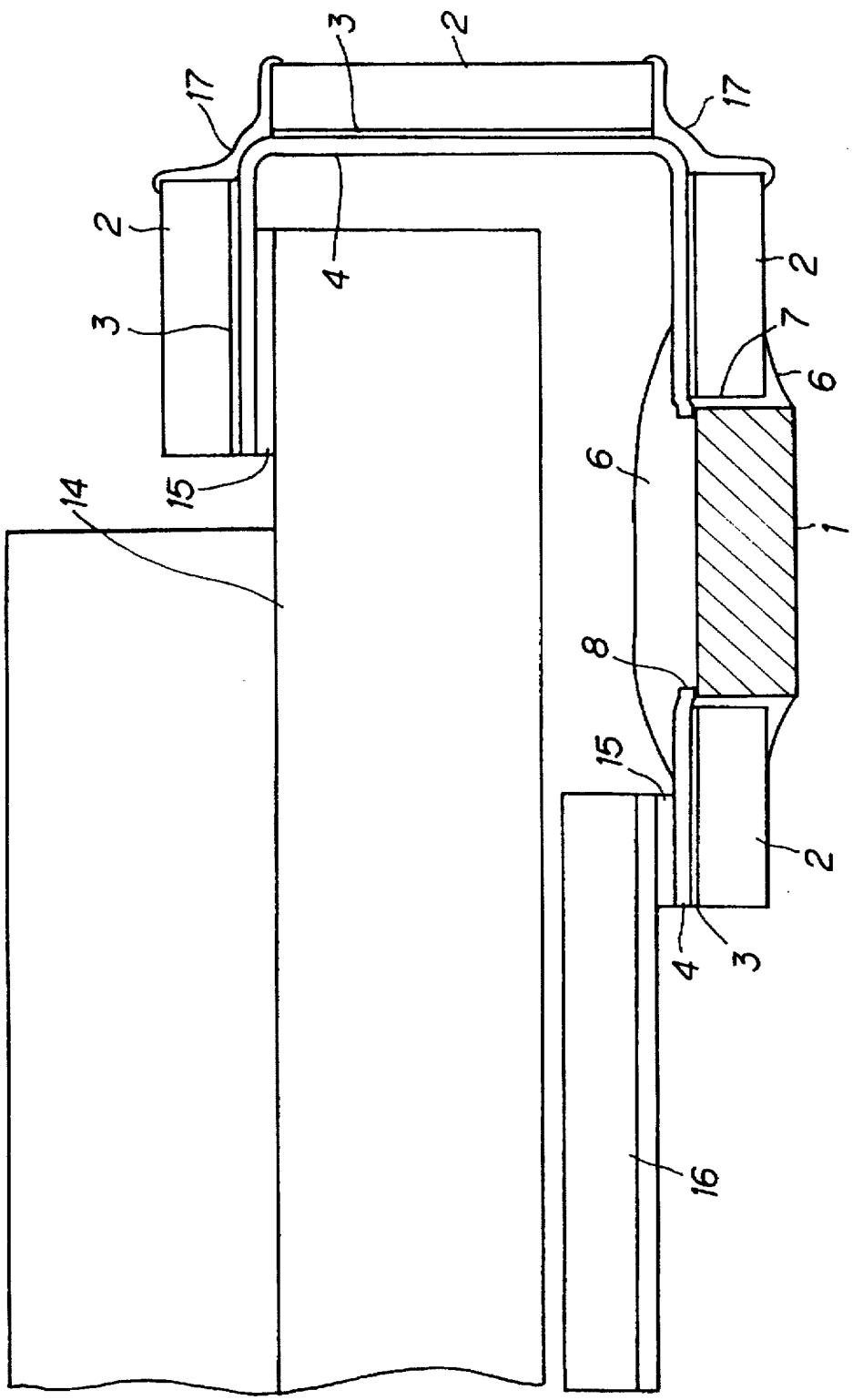
FIG. 3 is a view showing an example of a practical use of a flex type of TCP.
Figure 4:
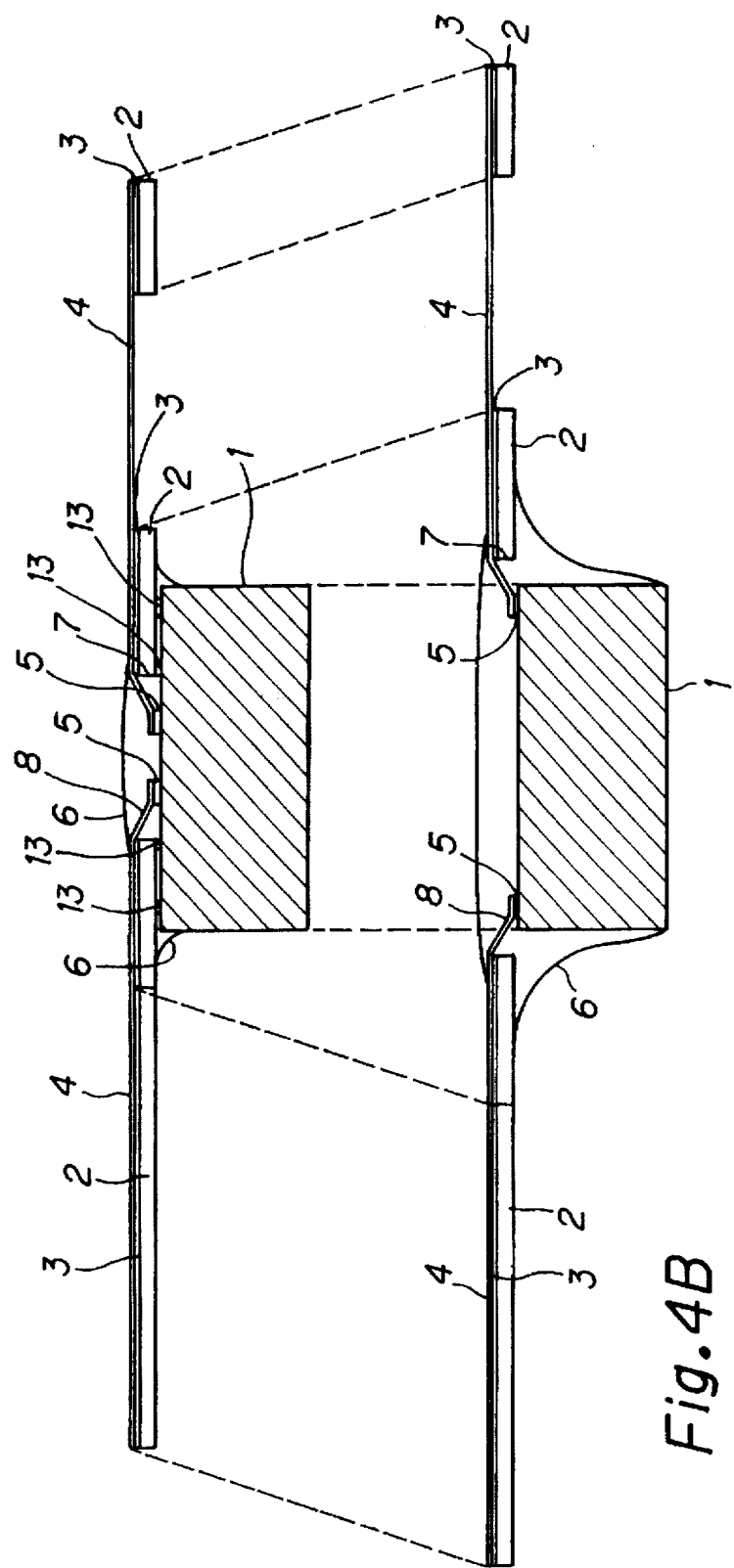
FIG. 4A is a sectional view showing a TCP for an LCD driver in accordance with the first embodiment of the invention.
FIG. 4B is a sectional view showing a conventional TCP for an LCD driver.
Figure 5:
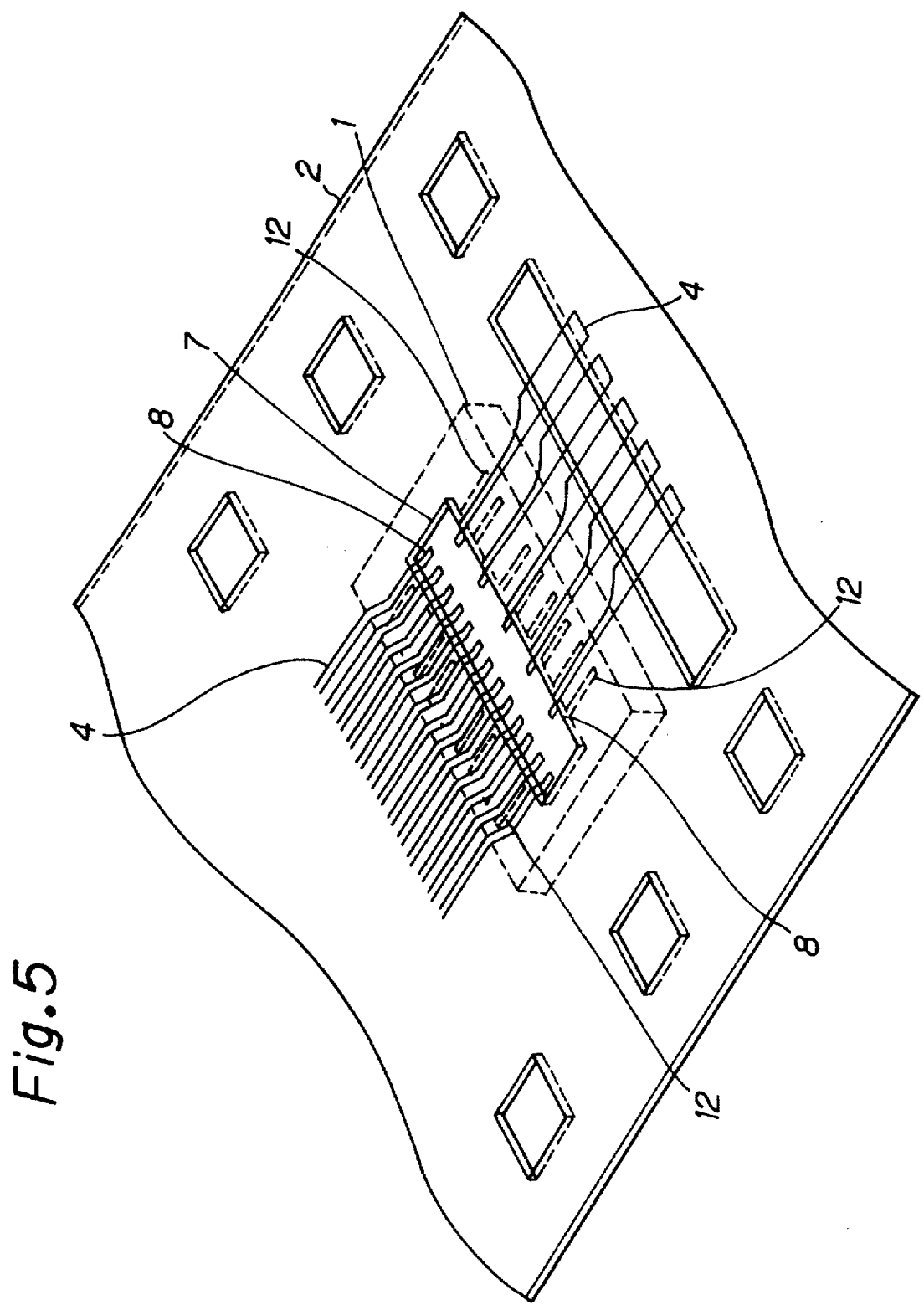
FIG. 5 is a perspective view showing the second embodiment of the invention in which resin-made projections are used.
Figure 6:
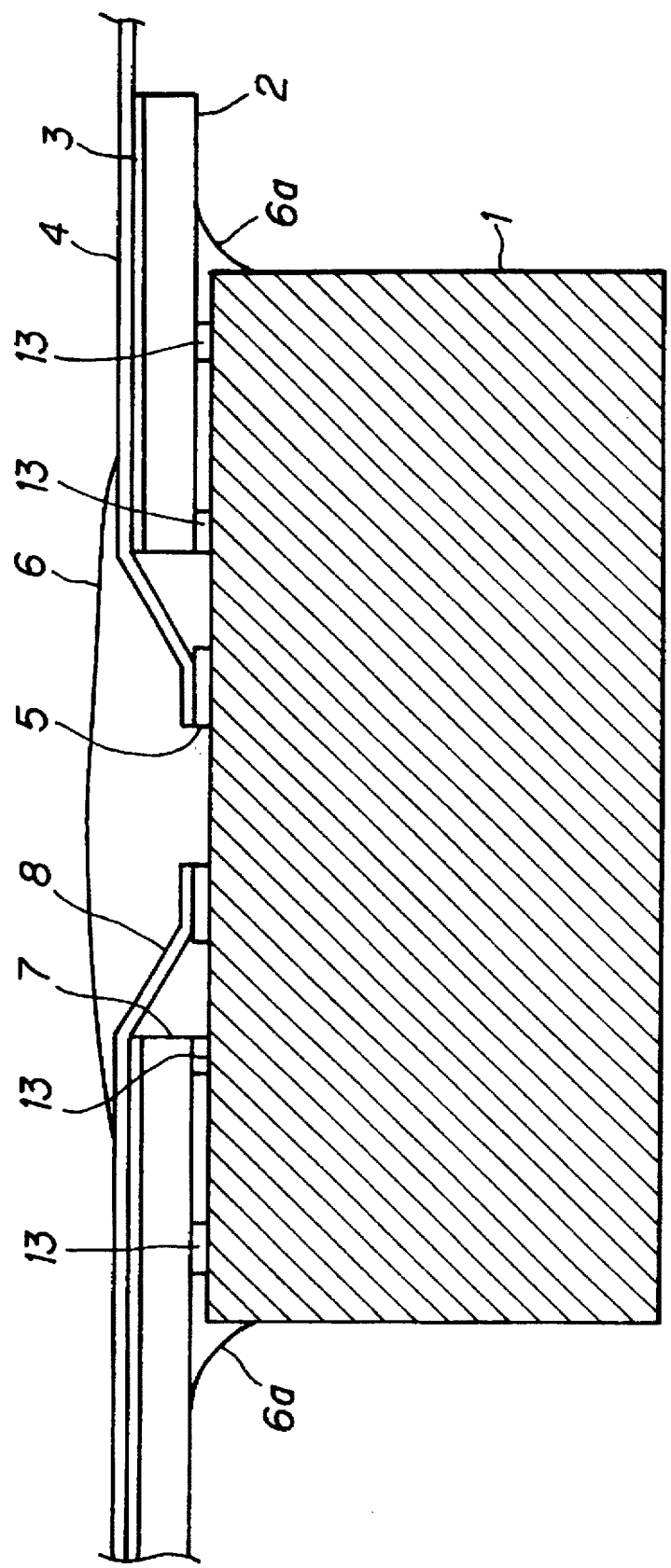
FIG. 6 is a sectional view showing an embodiment in which spacer bumps of the invention are used.
Figure 7:
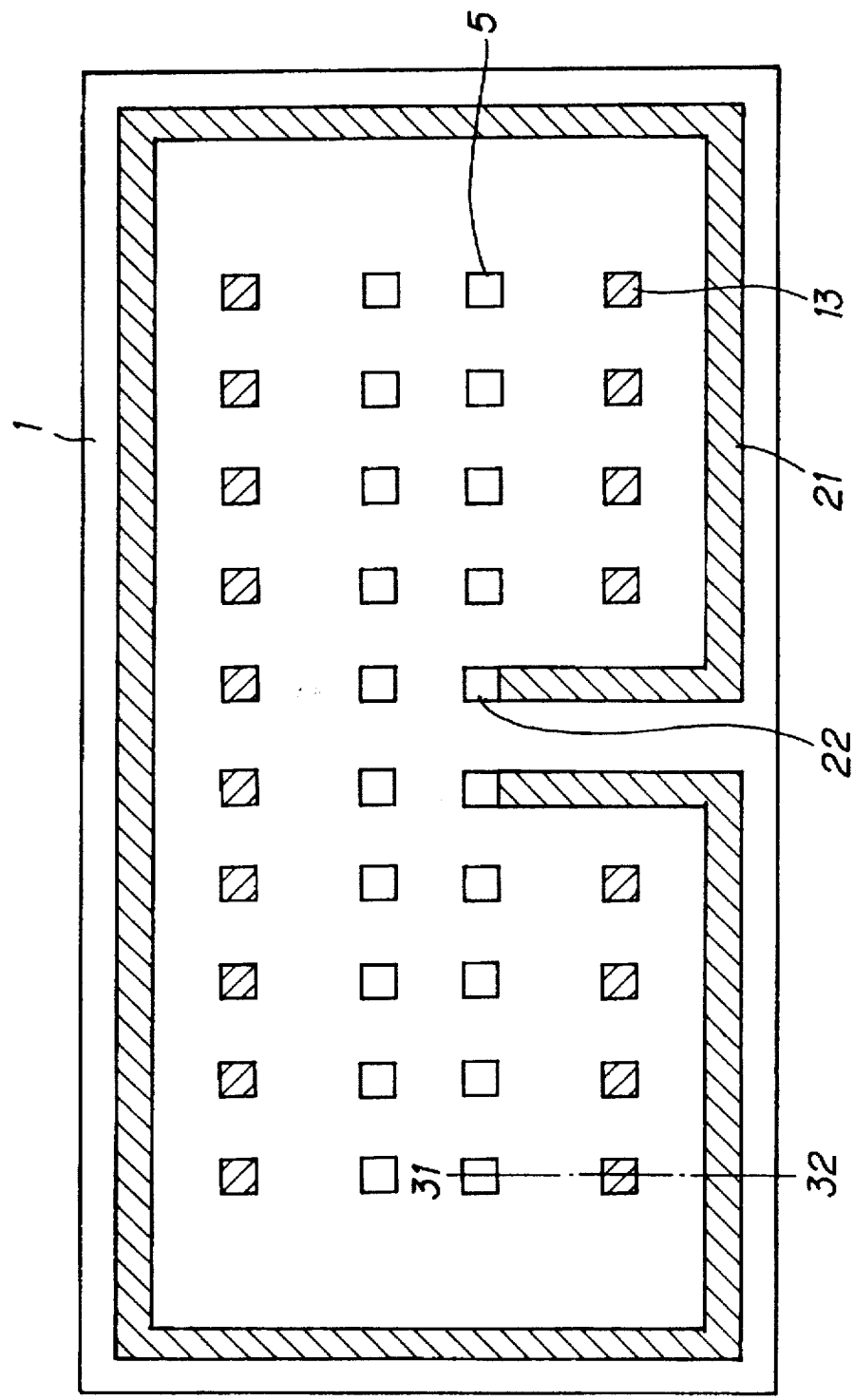
FIG. 7 is a plan showing the fourth embodiment where the spacer bumps of the invention are used to detect defects on the chip surface.
Figure 8:
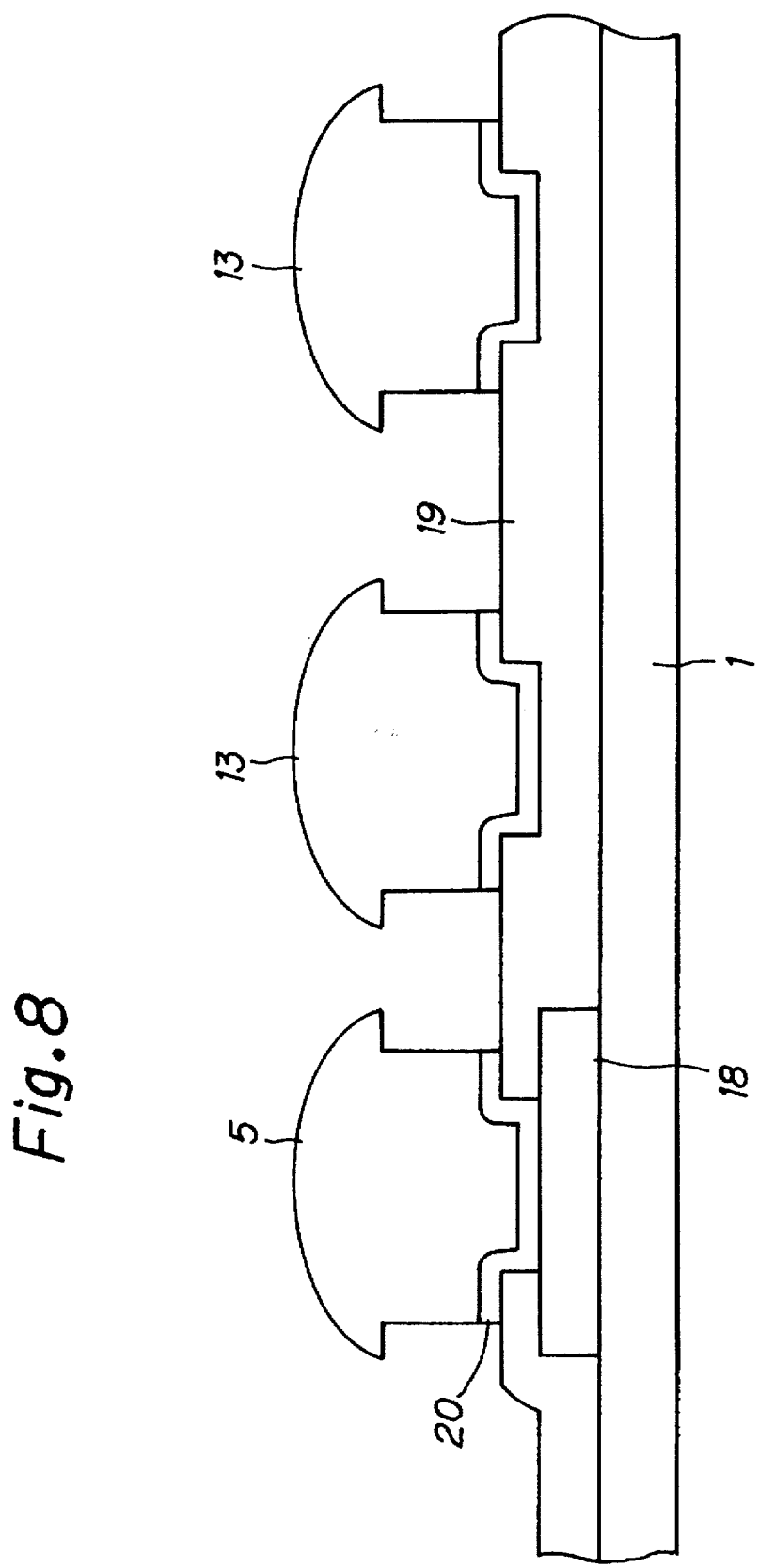
FIG. 8 is a view showing a section taken on the line 31-32 in FIG. 7.
Figure 9:
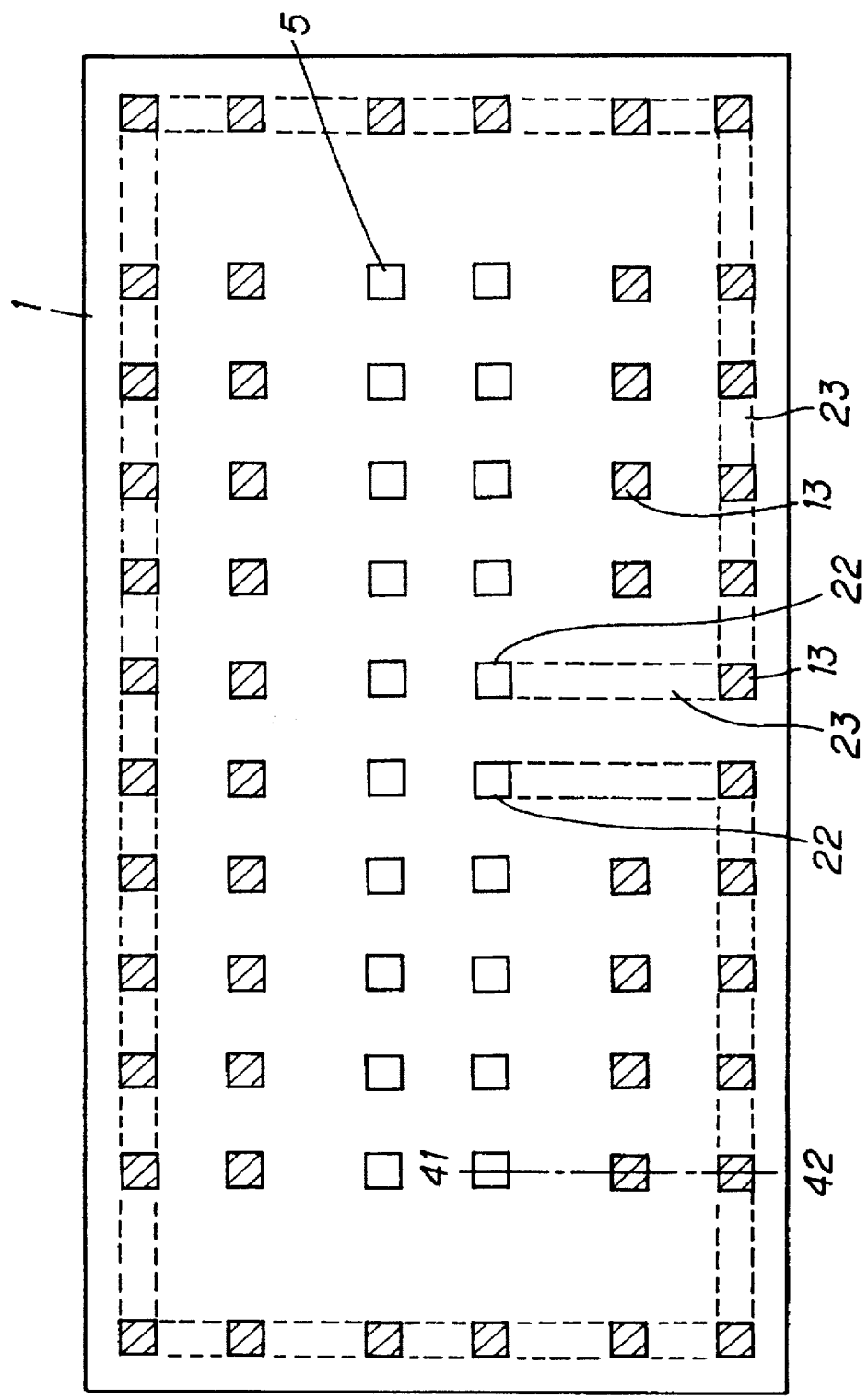
FIG. 9 is a plan showing the fifth embodiment where spacer bumps of the invention are used to detect defects on the chip surface.
Figure 10:
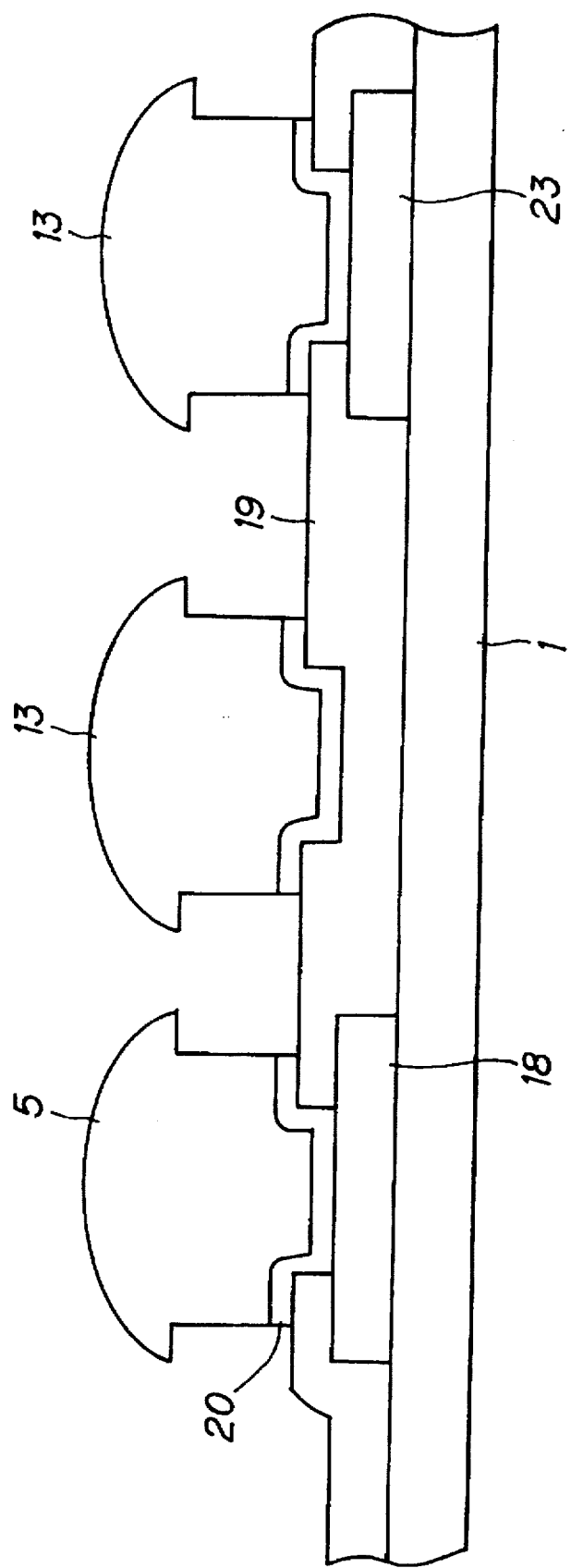
FIG. 10 is a view showing a section taken on the line 41-42 in FIG. 9.
Figure 11:
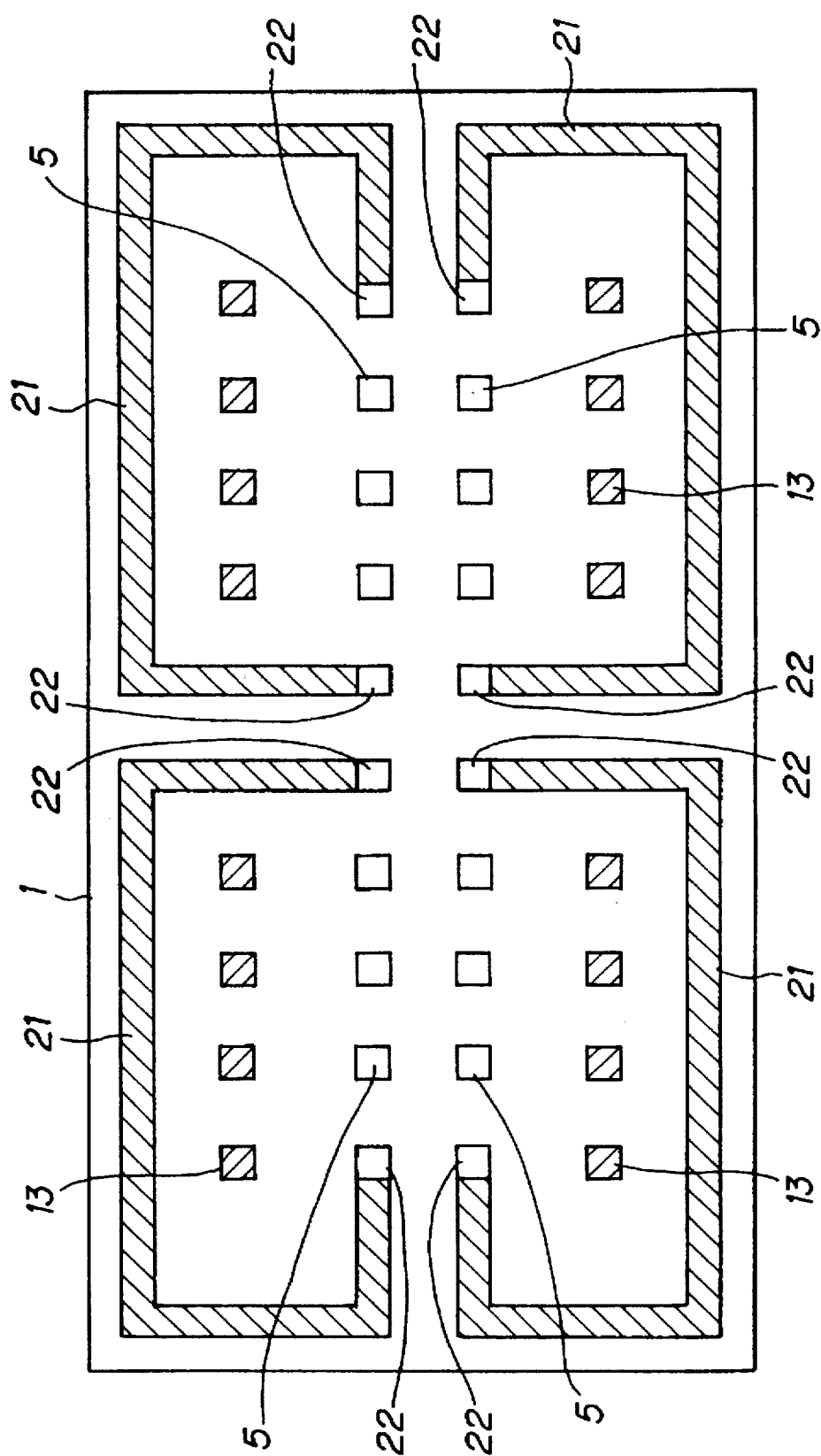
FIG. 11 is a plan showing the sixth embodiment where spacer bumps of the invention are used to detect defects on the chip surface.
Figure 12:
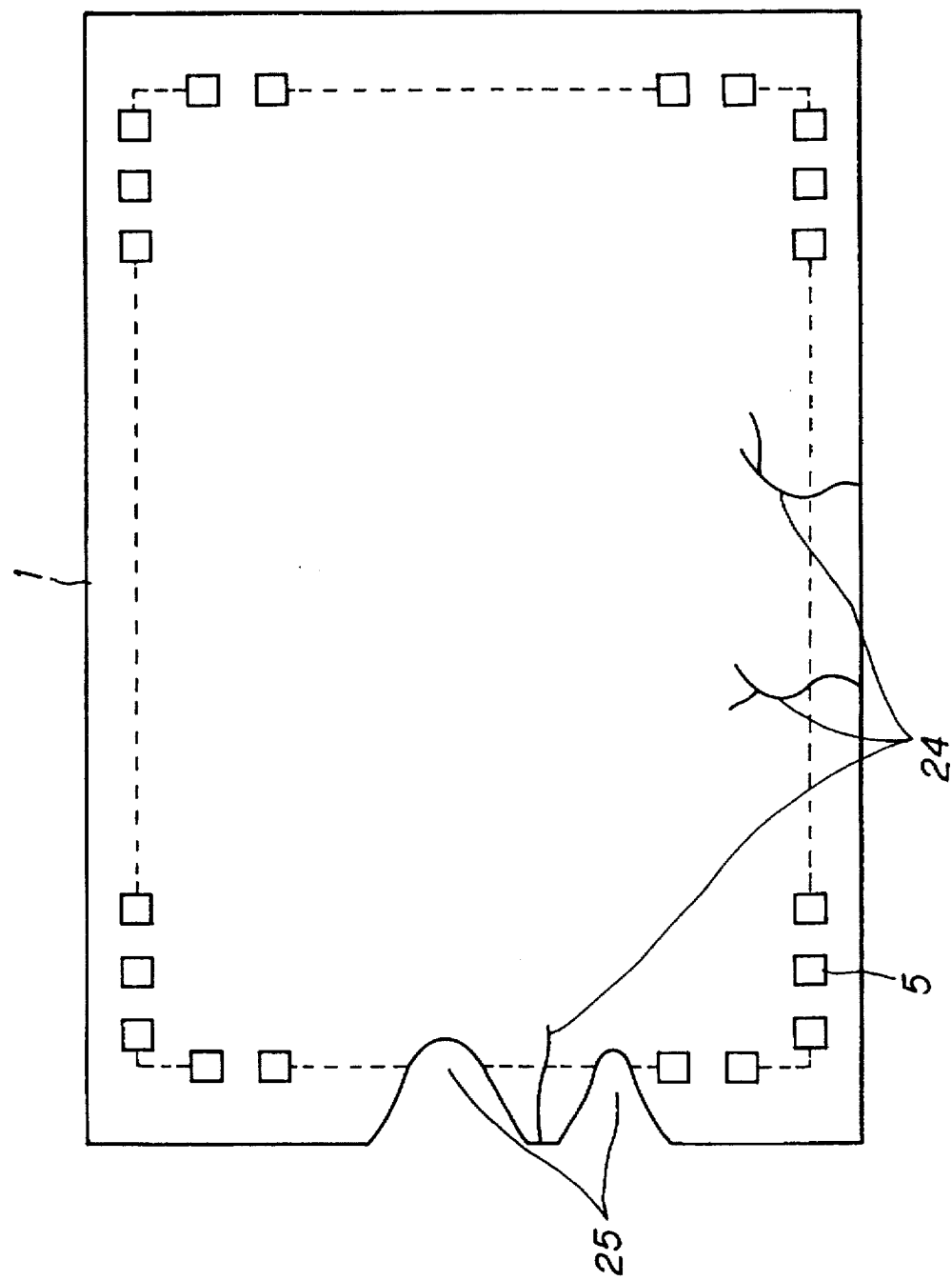
FIG. 12 is a plan showing a semiconductor chip with cracks and nicks formed after dicing a wafer.
Figure 13:
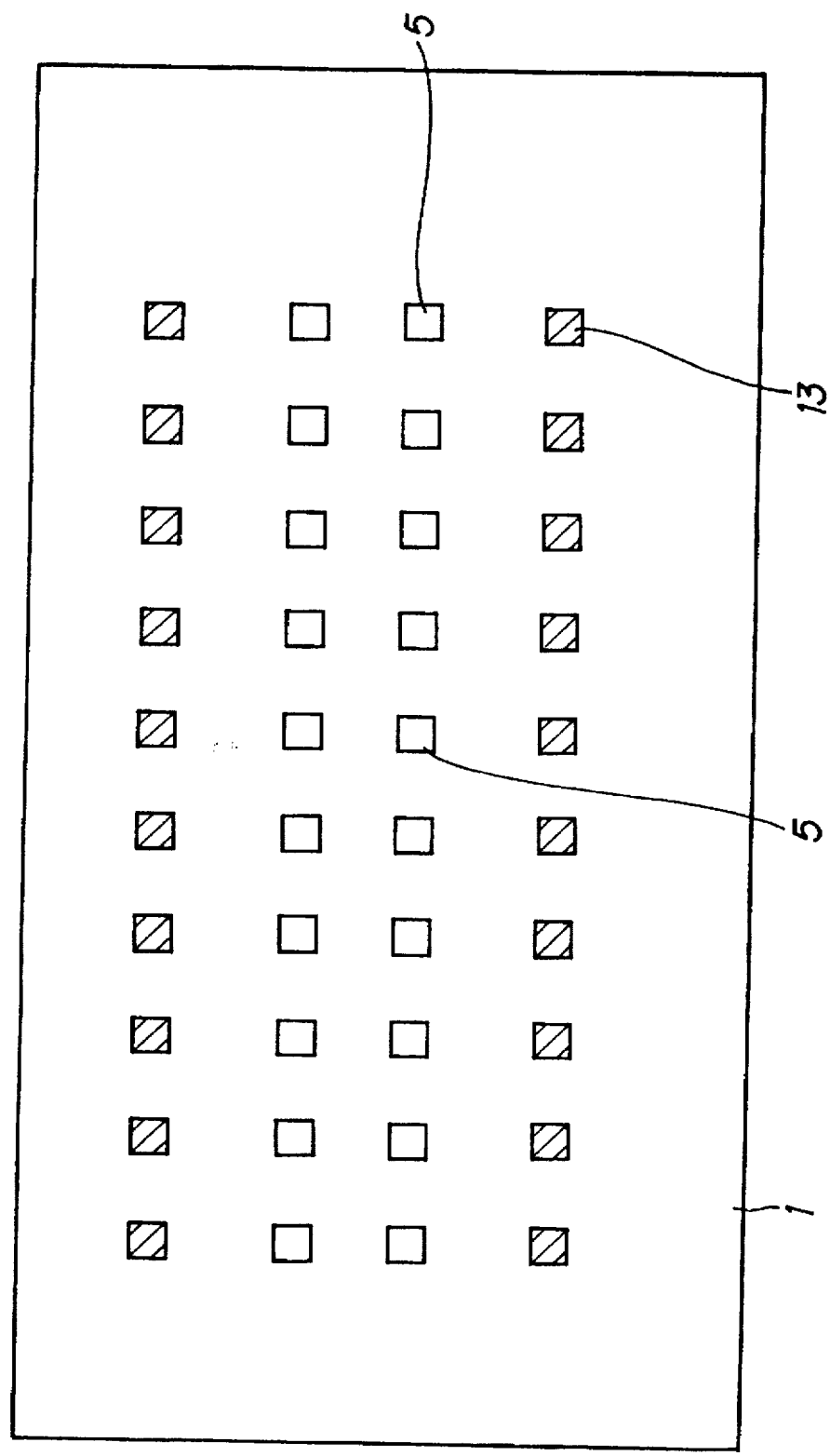
FIG. 13 is the first plan in which spacer bumps of the invention are arrayed in a single row.

FIG. 4A is a sectional view showing a TCP for an LCD driver in accordance with the first embodiment of the invention; FIG. 4B is a sectional view showing a conventional TCP for an LCD driver; FIG. 5 is a perspective view showing the second embodiment of the invention in which resin-made projections are used; FIG. 6 is a sectional view showing an embodiment in which spacer bumps of the invention are used; FIG. 7 is a plan showing the fourth embodiment where the spacer bumps of the invention are used to detect defects such as cracks, nicks etc. on the chip surface; FIG. 8 is a view showing a section taken on the line 31-32 in FIG. 7; FIG. 9 is a plan showing the fifth embodiment where spacer bumps of the invention are used for detecting defects such as cracks, nicks etc. on the chip surface; FIG. 10 is a view showing a section taken on the line 41-42 in FIG. 9; FIG. 11 is a plan showing the sixth embodiment where spacer bumps of the invention are used for detecting defects such as cracks, nicks etc. on the chip surface; FIG. 12 is a plan showing a semiconductor chip with cracks and nicks formed after dicing a wafer; and FIGS. 13 and 14 are views showing embodiments in which spacer bumps of the invention are arrayed in a single row.

In these figures, reference numerals indicates the following components; 1: a semiconductor chip; 2: an insulating film; 3: an adhesive; 4: a conductor pattern; 5: metal bumps; 6: a sealed resin; 7: a device hole; 8: an inner lead; 12: a resin-made projection; 13: a spacer bump; 18: an aluminum electrode; 19: a protecting film; 20: a barrier metal; 21: a spacer bump also serving as the interconnection for defect detection; 22: a defect-detecting bump; 23: a defect-detecting interconnection; 24: a crack; and 25: a nick.

Examples of the insulating film 2 are: a film with 75 μm or less in thickness, made up of a polyimide material such as 'Upilex (trade name)' a product of UBE industries, Ltd., 'Kapton (trade name)' a product of Du Pont-Toray Co., Ltd., and 'Apical (trade name)' a product of KANEKA CORPO- RATION; and a film with the same thickness, made up of other than polymide materials such as glass epoxy, BT resin, PET etc. If the insulating film 2 is too thick as compared to the height of the metal bump 5, the bent angle of the flexed portion of the conductor pattern 4 will be too steep resulting in deficient performance. In this embodiment, a film with 75 μm in thickness is used as the insulating film and a film of an epoxy material with 19 μm typ in thickness is used as the adhesive.

The conductor pattern 4 is formed of a copper foil of 18 μm typ thick, electrolytically etched and the solder-resist (not shown) can be print-applied to secure insulation. A rolled copper foil of 12 up to 35 μm thick can also be used for the conductor pattern. Further, the surface of the conductor pattern 4 is plated with tin, gold, nickel, or solder of 0.2 to 0.4 μm thick.

The semiconductor chip 1 is of slim-type having a size of 17,400 μm×1,500 μm with 240 output pads for the LCD driver, 30 pads for signal input, 130 dummy pads on the input side, four dummy pads on the output side. That is, 244 pads and 160 pads are arrayed in rows on the output and input sides, respectively, where pad pitches on the output sides are 68 μm each. The opposite pad rows on the output and input sides are spaced by 190 μm. The distance between the center of the pad on the output side and the chip edge on the output side is 955 μm and the distance between the device-hole edge and the chip edge on the output side is 700 μm. The distance between the device-hole edge and the chip edge on the input side is 100 μm. The distance between the device-hole edge on the input side and the slit portion edge for the input terminals is 350 μm. The distance between the chip edge on the input side and the slit portion edge for the input terminals is 250 μm. The device hole 7 has a size of 700 μm×17,200 μm and the center line of the device hole 7 corresponds to the center line of the two electrode pad rows.

The output terminals of the TCP on the LCD panel side is arranged in a pitch of 70 μm. The width of the area for interconnection wiring between the output terminals on the LCD panel side and the electrode pads of the semiconductor chip 1 requires 500 μm and can be formed between the device-hole edge and the chip edge.

In order to establish a necessary gap for filling the sealing resin 6 between the surface of the semiconductor chip 1 and the insulating film 2, a plurality of dummy bumps having a size of 50 μm×50 μm with 20 μm in height are arranged when the bumps are formed on the electrode pads. The characteristics of the sealing resin 6, the consistency and curing temperature etc., are appropriately selected so as to allow the sealing resin 6 to flow to the gap, and by estimating the difference of the stresses due to the sealed shape of the sealing resin 6.

The dummy bumps are to be formed at least near the device hole 7 and in the vicinity of the periphery of the semiconductor chip 1.

The length of the output terminals of the TCP is 2 mm and the length of the input terminals is 1.5 mm. Since the length of a meniscus 6a of the sealed resin on the semiconductor chip 1 side is not longer than 250 μm, the frame size of this TCP is 250+1,500+250+1,500=3,500 μm.

In contrast, FIG. 4B is a sectional view showing a case where the semiconductor chip 1 of the same size as in FIG. 4A is designed and packaged by using the conventional slim TCP. In comparison with that shown in FIG. 4A, the size of the device is made large by 500 μm for the region for the interconnection wiring on one side (1 mm for both input and output sides), 200 μm for the gap of the device hole 7 and 500 μm×2 for the resin areas. In this case, the frame size is 500+100+1,500+100+500+1,500=4,200 μm. That is, the frame size of the conventional TCP is greater by 700 μm than that of the TCP of the invention shown in FIG. 4A. The mechanical strength of the TCP of the invention is increased twice or more of that of the conventional structure.

Next, the second embodiment of the invention will be described.

A TCP shown in FIG. 5 is formed by printing resin projections 12 on surface of the insulating film 2 in order to create a necessary gap. Several resin projections 12 each have a size of 200 μm×400 μm and is formed extended in the direction from the device hole edge toward the chip edge. The resin projection is 10 to 40 μm in height.

FIG. 6 shows an example of a TCP in which metal bumps 13 for spacer having a size of 50 μm×50 μm of 20 μm in height are formed on the semiconductor chip 1.

Next, the third embodiment of the invention will be explained.

A film made up of aramid with a thickness of 38 μm was used as the material of the insulating film 2 in the FIG. 4A. An epoxy resin having a liner expansion coefficient of $28\times10^{-6}/°C$. was used as the sealing resin 6.

It has been confirmed that the polyimide film which has a linear expansion coefficient of 16 to $20\times10^{-6}/°C$. and has been used as the material for the insulating film of the typical TCP, could be used reliably as long as the thickness of it is equal to 75 μm or less. When the insulating film 2 or sealing resin 6 which has a linear expansion coefficient of $30\times10^{-6}/°C$. or more is used, or when the insulating film having a thickness of 125 μm, for example, is used, there is a great probability of causing troubles which degrade the reliability. That is, since there is a great difference in the linear expansion coefficients between the insulating film and the semiconductor chip 1 ($2.4\times10^{-6}/°C$.), this causes different rates of expansion between the semiconductor chip 1 and the insulating film 2 or the semiconductor chip 1 and the sealing resin 6 in the thermal cyclic test, whereby stress is generated on the surface of the semiconductor chip 1 or inner leads 8, thus degrading the reliability. In the case of the embodiment, since the aramid film has an extremely low linear expansion coefficient ($4\times10^{-6}/°C$.) which is very close to that of the semiconductor chip 1 ($2.4\times10^{-6}/°C$.), a further improved reliability can be obtained as compared to the case where the aforementioned polyimide film is used.

When the wafer was diced into chips or during the conveyer process such as die-boding or wire-boding etc., there occurred cracks or nicks in the semiconductor chip as shown in FIG. 12, which caused deficiency such as disconnection of functional elements, generation of leak current, short-circuit etc. In order to detect cracks or nicks of the chips by electric methods such as short-circuit check, open-circuit check or leak test etc., the invention provides supporting elements which have structures shown in FIGS. 7 to 11.

That is, in accordance with the forth embodiment of the invention, a spacer bump 21 also serving as the interconnection for defect detection, which is arranged loop-wise in the peripheral part around the element-forming region on the semiconductor chip 1, and each end of the spacer bump 21 is connected to a separately formed, defect-detecting metal bump 22, as shown in FIGS. 7 and 8. Further, in accordance with the fifth embodiment, spacer bumps 13 are formed loop-wise in the peripheral part around the element-forming region on the semiconductor chip 1 and electrically integrally connected by a defect-detecting interconnection 23 made up of poly-silicon, the diffusion layer or aluminum, so as to be connected to separately formed, defect-detecting metal bumps 22, as shown in FIGS. 9 and 10.

In these arrangements, cracks 24 or nicks 25 on the surface of the semiconductor chip 1 can be more reliably detected by performing some tests with the defect-detecting metal bumps 22 biased at a fixed voltage. Specifically, defects can be detected by performing the open-circuit check with the bumps 22 biased to the ground potential level, or performing the conduction check or measuring the leak current with both the bumps 22, 22 applied with a voltage of, for example, 5 V.

It is noted that the structure shown in FIGS. 9 and 10 in which spacer bumps 13 are connected by the defect-detecting interconnection 23 consisting of poly-silicon, the diffusion layer or aluminum can be produced at a lower cost and allows more reliable detection of cracks 24 and nicks 25 as compared to the structure of FIGS. 7 and 8 in which the spacer bump 21 also serving as the interconnection for defect detection is used. Needless to say, the width of the defect-detecting interconnection 23 consisting of poly-silicon, the diffusion layer or aluminum can be formed as narrow as possible up to the minimum line width specified by each process.

In accordance with the sixth embodiment, as shown in FIG. 11, the element-forming region of the semiconductor chip 1 is partitioned into a predetermined number of parts, for example, four parts, and the spacer bump 21 also serving as the interconnection for defect detection is formed loop-wise in each part. In this case, it is possible to form resin-flow passages.

The spacer bump 13 or the spacer bump 21 also serving as the interconnection for defect detection may be formed of other conductive material such gold or copper etc.

Although two rows of spacer bumps 13 or spacer bumps 21 also serving as the interconnection for defect detection are arranged in the above embodiments, it is also possible to arrange them in a single row as shown in FIGS. 13 and 14.

As has been detailed hereinabove, by using the features of the invention, it is possible to markedly reduce the size of the TCP as compared to the conventional TCP whose size was determined by the size of the semiconductor chip. Particularly, in the application to LCD panels, the frame size of the LCD panel can be reduced, therefore, it is possible to increase the ratio of the LCD area in a limited module size.

Since the structure of the insulating film laid over the semiconductor chip markedly improves the mechanical strength of the TCP, it is possible to apply the TCP of the invention to those products such as portable products, or car-mounted products etc., in which a strict reliability of the device against impacts or vibrations is demanded.

Further, since the semiconductor chip and the insulating film are supported with a fixed spacing distance, this structure allows the sealing resin to surely seal the semiconductor chip surface which lies between the semiconductor chip and the insulating film.

By using an aramid film as the insulating film, it is possible to reduce the stress by 30% or more.

Further, since the conductive supporting elements are connected loop-wise in the peripheral part around the element-forming region, it is possible to measure the voltage at both ends. Accordingly, it is possible to detect cracks or nicks on the semiconductor surface by using electric methods in the TCP with a device hole which is smaller than the element-forming region of the semiconductor chip.

What is claimed is:

1. A tape carrier package comprising:

an insulating film having a device hole;

a conductor pattern formed on said insulating film; and conductor leads electrically connected to said conductor pattern and projected inward beyond the edge of the device hole, said conductor leads being in direct contact with and electrically connected to electrode pads of a semiconductor chip, the semiconductor chip having an element forming region and element forming surface;

wherein the electrode pads of said semiconductor chip are arranged in at least two opposite rows which are parallel to two sides, the sides being opposite to each other, of said semiconductor chip; the two opposite rows of pads are disposed closer to the center of the two rows than to an edge of semiconductor chip; the device hole is positioned within the element-forming region of said semiconductor chip; and the element-forming surface of the semiconductor chip containing the region between said insulating film and said semiconductor chip, is sealed with a sealing resin.

2. A tape carrier package according to claim 1 wherein supporting means for spacing said semiconductor chip from said insulating film by a predetermined distance is provided between said semiconductor chip and said insulating film.

3. A tape carrier package according to claim 1 wherein the linear expansion coefficient of said insulating film and the linear expansion coefficient of said sealing resin are both $30 \times 10^{-6}/°C$. or less.

4. A tape carrier package according to claim 2 wherein the linear expansion coefficient of said insulating film and the linear expansion coefficient of said sealing resin are both $30 \times 10^{-6}/°C$. or less.

5. A tape carrier package according to claim 2 wherein said supporting means is an integrally formed structure of a conductive material or a plurality of elements of a conductive material, and the structure or the elements are arranged loop-wise in the peripheral part around the element-forming region of said semiconductor chip, and are electrically integrally connected to outside electrodes.

6. A tape carrier package according to claim 4 wherein said supporting means is an integrally formed structure of a conductive material or a plurality of elements of a conductive material, and the structure or the elements are arranged loop-wise in the peripheral part around the element-forming region of said semiconductor chip, and are electrically integrally connected to outside electrodes.

7. A tape carrier package according to claim 1, wherein the device hole has a dimension which is less than a dimension of a top surface semiconductor chip that directly faces the device hole.

* * * * *